United States Patent
Burgio

(10) Patent No.: US 9,559,717 B1
(45) Date of Patent: Jan. 31, 2017

(54) DYNAMIC RANGE CONTROL METHOD AND DEVICE, APPARATUS AND COMPUTER PROGRAM PRODUCT

(71) Applicant: STMicroelectronics S.R.L., Agrate Brianza (IT)

(72) Inventor: Carmelo Burgio, Bergamo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/053,649

(22) Filed: Feb. 25, 2016

(30) Foreign Application Priority Data

Sep. 9, 2015 (IT) .......................... 102015000050051

(51) Int. Cl.
 H03M 1/66 (2006.01)
 G06F 3/16 (2006.01)

(52) U.S. Cl.
 CPC ................. H03M 1/66 (2013.01); G06F 3/165 (2013.01)

(58) Field of Classification Search
 CPC .......... H03M 1/187; H03M 1/18; H03M 1/70; H03M 1/49; H03M 1/785; H03M 1/808; H03M 1/78; H03M 1/68; H03M 1/66; G06F 3/165
 USPC ................................................. 341/140–170
 See application file for complete search history.

(56) References Cited

U.S. PATENT DOCUMENTS

| | | | | | |
|---|---|---|---|---|---|
| 5,828,328 A | * | 10/1998 | Marks | .................. | H03M 1/187 341/132 |
| 5,845,092 A | * | 12/1998 | Hsieh | ...................... | G10L 25/87 704/248 |
| 5,977,811 A | * | 11/1999 | Magazzu | ............. | H03K 17/063 323/317 |
| 6,252,536 B1 | * | 6/2001 | Johnson et al. | ...... | H03M 1/187 330/253 |
| 6,381,570 B2 | * | 4/2002 | Li et al. | .................. | G10L 19/18 704/226 |
| 6,707,492 B1 | * | 3/2004 | Itani | ...................... | H03M 1/187 341/139 |
| 6,892,177 B2 | * | 5/2005 | Oliveira et al. | ........ | H03M 1/70 341/139 |
| 6,956,919 B2 | * | 10/2005 | Amar et al. | ............ | H04L 25/45 375/316 |
| 7,215,202 B2 | * | 5/2007 | Al-Shyoukh et al. | .... | H03G 1/0088 330/129 |

(Continued)

FOREIGN PATENT DOCUMENTS

| WO | 00/01073 A1 | 1/2000 |
|---|---|---|
| WO | 2004/095709 A2 | 11/2004 |

*Primary Examiner* — Lam T Mai
(74) *Attorney, Agent, or Firm* — Seed IP Law Group LLP

(57) ABSTRACT

In a signal processing chain producing an analog output signal from a digital input signal, dynamic range control applies to the analog output signal a dynamic range control gain as a function of an input gain applied to the digital input signal. The dynamic range control gain is applied to the analog output signal with a delay relative to the input gain applied to the digital input signal. A first flag signal is generated for the analog output signal and a second flag signal for the digital input signal, each flag assuming first and second levels and set to the first level when the signal from which the flag is generated is within a certain amplitude range. The first and second flag signals are compared and delay of application of the dynamic range control gain to the analog output signal controlled as a function of a result of the comparison.

20 Claims, 12 Drawing Sheets

(56) References Cited

U.S. PATENT DOCUMENTS

| | | | |
|---|---|---|---|
| 7,468,687 B2 * | 12/2008 | Nozawa et al. | G09G 5/005 |
| | | | 341/118 |
| 7,659,707 B2 * | 2/2010 | Eken et al. | G01R 21/01 |
| | | | 324/123 R |
| 8,362,936 B2 | 1/2013 | Ledzius et al. | |
| 2006/0017597 A1 * | 1/2006 | Jaspers | H04N 5/235 |
| | | | 341/155 |

* cited by examiner

DYNAMIC RANGE CONTROL METHOD AND DEVICE, APPARATUS AND COMPUTER PROGRAM PRODUCT

BACKGROUND

Technical Field

The description relates to dynamic range control.

One or more embodiments may apply, e.g., to dynamic range control in audio systems.

Description of the Related Art

Dynamic range control systems are widely used in several application areas, such as in audio systems.

A typical application is related to the optimization of the dynamic range of a signal input to a Digital-to-Analog Converter (DAC or D2A), e.g., in order to avoid saturation for high dynamic range signals and/or to improve the Signal-to-Noise Ratio (SNR) for low level signals.

BRIEF OBJECT

One or more of the disclosed embodiments provide an improved solution for dynamic range control.

One or more embodiments relate to a device and an apparatus (e.g., an audio chain) including such a device as well as to a computer program product loadable into the memory of at least one processing device (e.g., a digital signal processor (DSP)) and including software code portions for executing the steps of a method when the product is run on at least one computer. As used herein, reference to such a computer program product is understood as being equivalent to reference to a computer-readable means containing instructions for controlling a processing system in order to co-ordinate implementation of a method according to one or more embodiments. Reference to "at least one processor device" is intended to highlight the possibility for one or more embodiments to be implemented in modular and/or distributed form.

The claims are an integral part of the disclosure of one or more exemplary embodiments as provided herein.

One or more embodiments may be based on the recognition that a (fully) digital solution can be used for dynamic range control of an output analog signal since a sampled version of the signal subjected to DAC conversion is available as an. For instance, in the case of an audio processing chain fed with a conventional digital audio signal (e.g., according to the compact disk (CD) "Redbook" standard), a sampled version (44.1/48.0 kHz Fs sampling frequency) of the audio stream is available at a digital decoder.

BRIEF DESCRIPTION OF THE SEVERAL VIEWS OF THE FIGURES

One or more embodiments will now be described, by way of example only, by referring to the enclosed figures, wherein.

DETAILED DESCRIPTION

In the ensuing description one or more specific details are illustrated, aimed at providing an in-depth understanding of examples of embodiments of the present disclosure. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Figure 1:
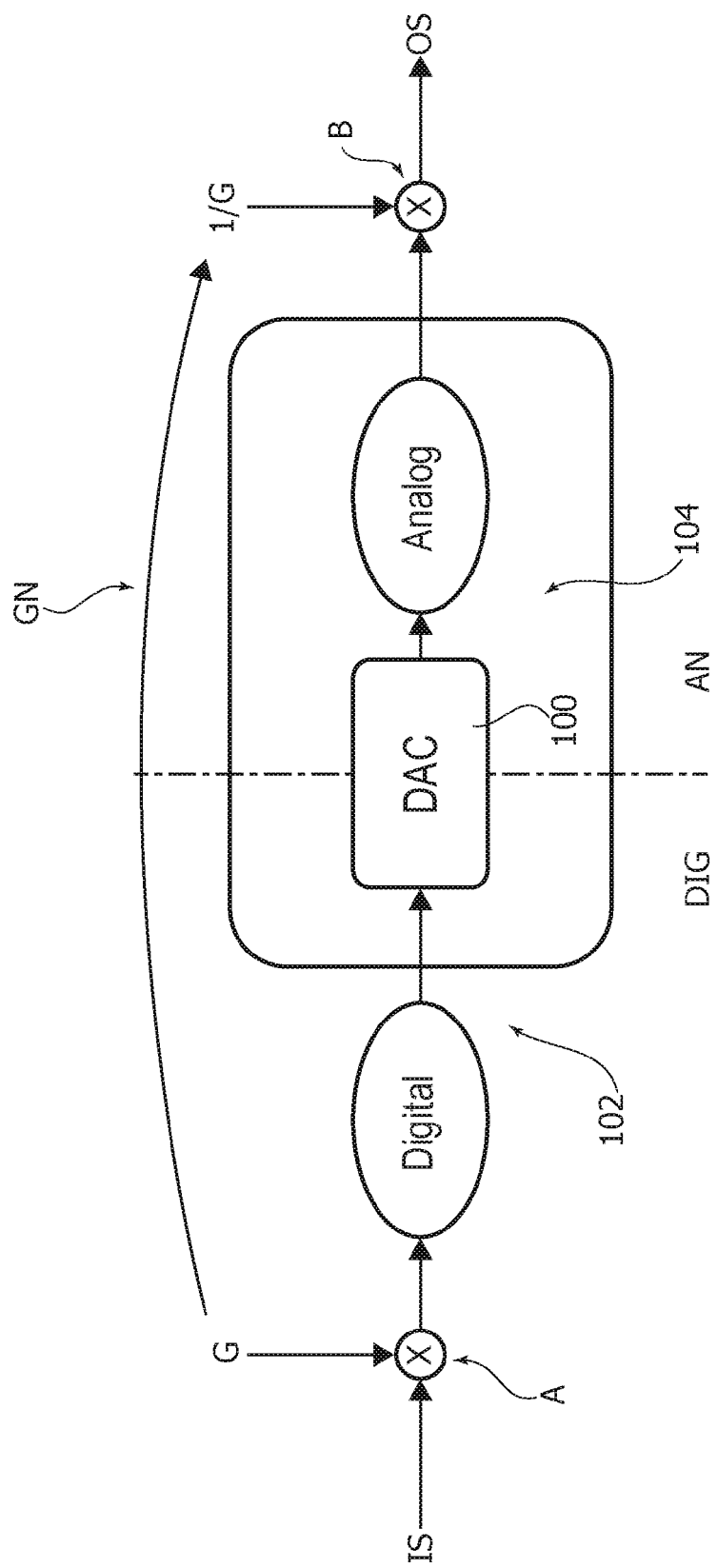
FIG. 1 is a schematic representation of a possible scenario of use of one or more embodiments of the present disclosure.

FIG. 1 is a schematic representation of a possible scenario of use of one or more embodiments wherein a (digital) input signal IS is fed to a Digital-to-Analog Converter (DAC or D2A) 100 to generate an (analog) output signal OS.

For the sake of simplicity and generality the input signal to the converter 100 will be assumed to be a signal of a notional normalized unitary amplitude with a (variable) gain G applied to it in the digital domain at a input node A with a corresponding (reciprocal) gain 1/G applied in the analog domain at the DAC output node B to restore the input amplitude.

Such a simple model of dynamic range control is adapted to provide a general representation of a dynamic range control layout where:

a signal IS is fed to the DAC 100 with an amplitude as represented by a (variable) gain G, and the output gain (here 1/G, that is possibly an attenuation) is applied in order to obtain an output signal OS where the variation in the amplitude here represented by the gain G) in the input signal is compensated.

In one or more embodiments, the output gain may not be the exact reciprocal of the input gain, e.g., by providing for an overall gain/attenuation between IS and OS. A model as depicted in FIG. 1 (and FIG. 5 as well) will similarly apply also to those embodiments with an overall gain/attenuation between IS and OS.

One or more embodiments may apply to layouts including, between the nodes A and B:

on the digital side DIG (left of the vertical dashed line in FIG. 1), one or more digital blocks, collectively indicated by 102, which may be well characterized at a design stage;

on the analog side AN (right of the vertical dashed line in FIG. 1), one or more analog blocks, collectively indicated by 104, which may exhibit an intrinsic uncertainty in their parameters due, e.g., manufacturing process spreads.

Insofar as dynamic range control is concerned, the foregoing may apply primarily to two parameters, e.g.:

the unknown delay Tan applied by the analog part 104 to the signal coming from the output of the DAC 100, which adds to a (generally known) delay Tdig applied to the signal as a result of propagating through the digital blocks 102;

the analog gain, which may not "exactly" have the desired value (e.g., 1/G), but practically just an approximation of it.

In certain applications, the error introduced by the analog gain 1/G may be neglected as it may not be relevant for most practical applications.

Conversely, the time delay occurring between the time when a gain (amplitude) G is applied at node A and the time a gain (e.g., 1/G) is applied at node B in order to effect a dynamic range control may be critical for various applications.

For instance, by referring to the model depicted in FIG. 1, when the envelope of the incoming signal in the digital section reaches a certain threshold (high or low threshold for high level or low level signals, respectively), an appropriate digital gain may be applied to the data stream. Accordingly, in the analog domain, a corresponding (e.g., reciprocal) gain is be applied at the appropriate time in order to compensate the digital gain. In this way the correct functionality of the DAC is guaranteed and adequate performance achieved.

In one or more embodiments this process may involve a gain notification function GN by means of which the output node B is "notified" that a gain (amplitude) G is applied at the node A so that a corresponding gain (e.g., 1/G) can be applied at the node B.

In one or embodiments, the gain notification function GN may be implemented in various known ways (e.g., at the hardware level, with the analog gain at node B determined as a function of a bit pattern of the input signal).

Figure 2:
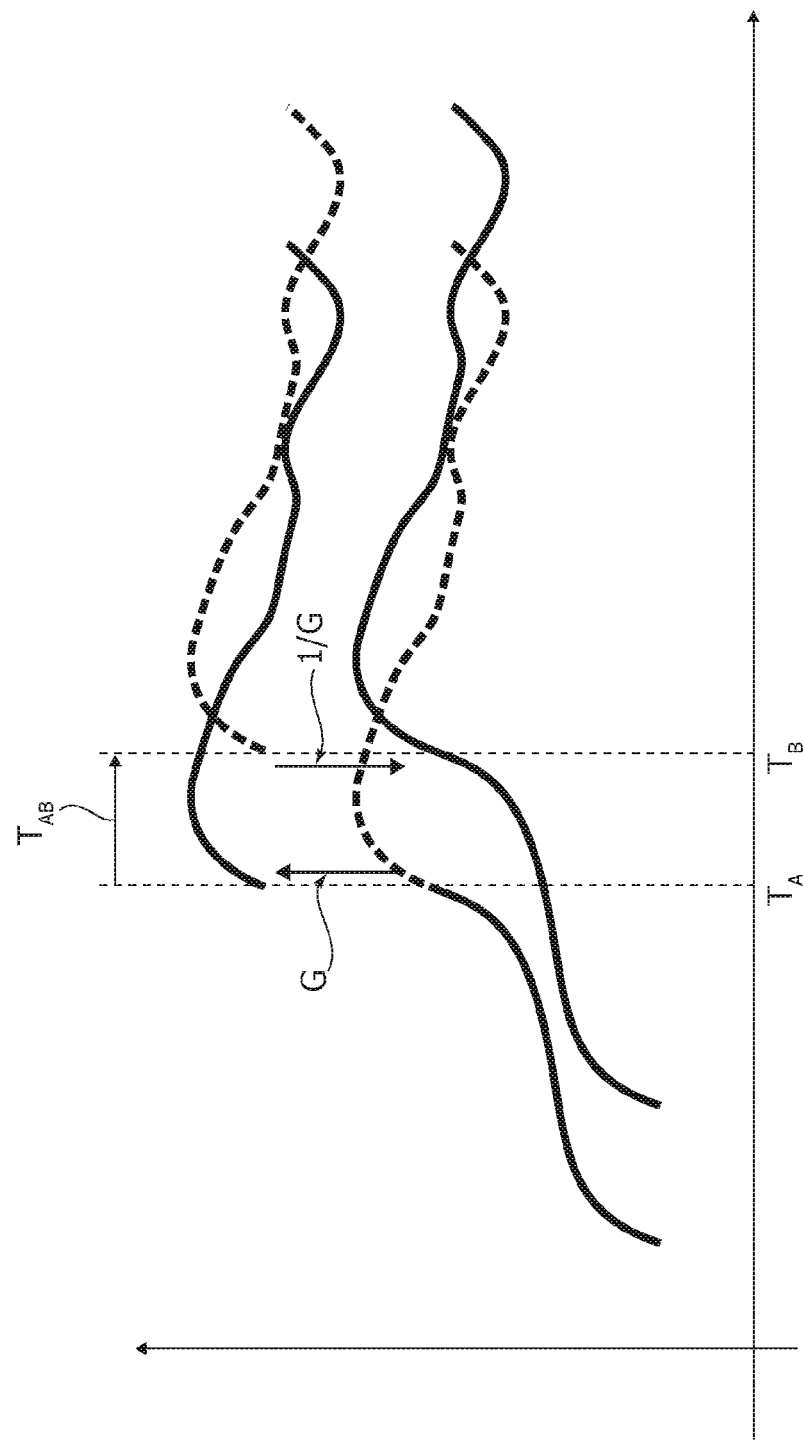
FIGS. 2 and 3 are timing diagrams showing the possible behavior of certain signals in such a scenario.

FIG. 2 schematically shows a possible global effect if the signal propagating between the nodes A and B of FIG. 1 were to experience a fixed delay (e.g., $T_{AB}$), as may be the case of Tdig (alone).

In that case, the input signal may experience a gain (change) G at time $T_A$, causing the signal, e.g., to "skip" upwards from the time behavior depicted in dashed line to the time behavior depicted in full line. This skip upward may then be compensated by a dynamic range control by applying to the output signal at time $T_B$—after the same fixed propagation time $T_{AB}$ of the signal from the node A to the node B—a range control gain (e.g., an attenuation 1/G) causing the output signal OS, e.g., to "skip" downwards from the time behavior depicted in dashed line back to the time behavior depicted in full line. In such a case, the delay will have no negative effects on dynamic range control, insofar as the compensation gain 1/G will be able to be applied with the same delay experienced by the signal between the nodes A and B.

Figure 3:
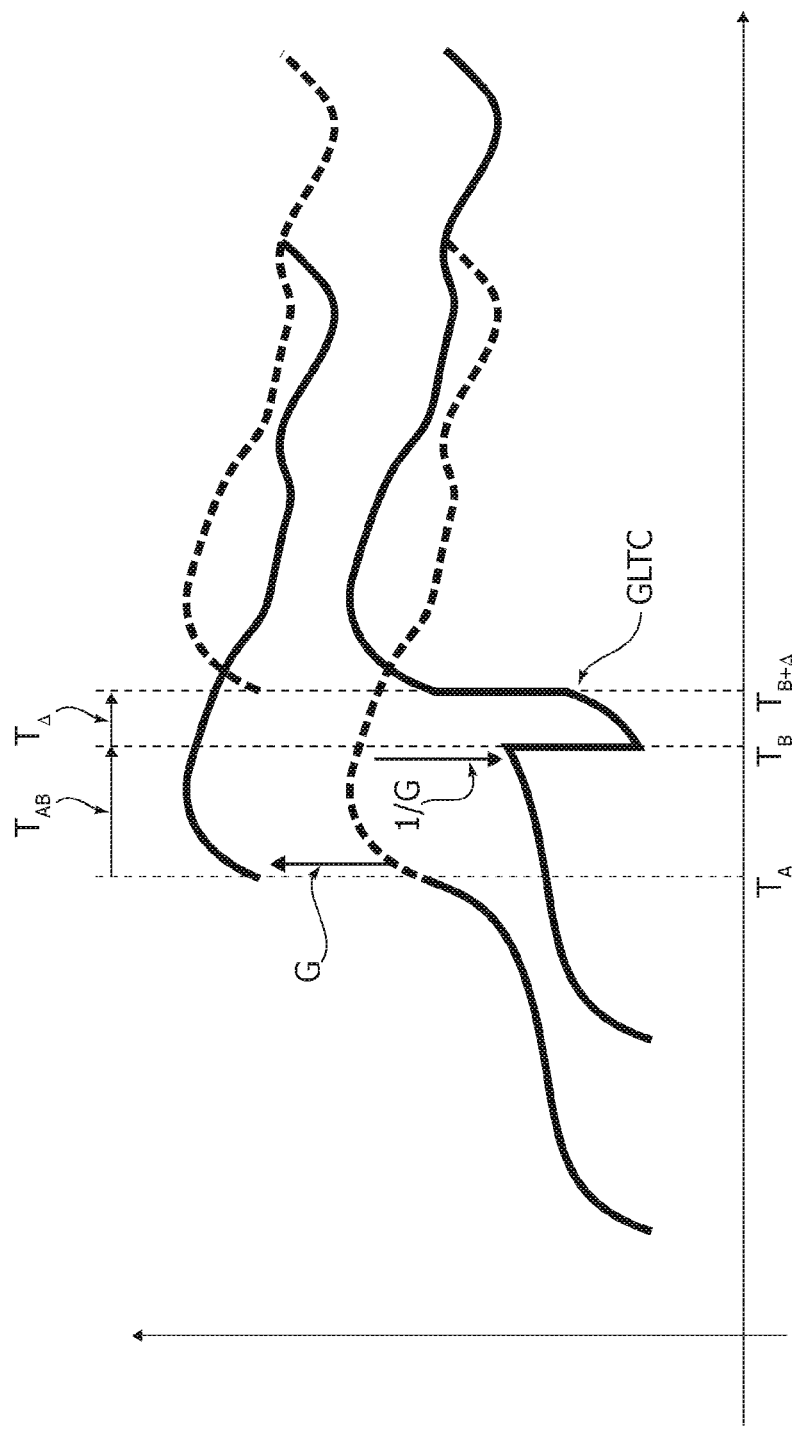

By way of contrast, FIG. 3 schematically represents the global effect in the case the delay experienced by the signal between the nodes A and B is not a simple (known) fixed delay (e.g., $T_{AB}$) but also includes, due to the signal propagating through the analog part 104, an additional delay $T_A$ which may be technology-dependent and, more generally, not exactly known.

This uncertainty may affect the time $T_{B+A}$ when the range control gain (e.g., 1/G) is applied at node B to cause the output signal OS, e.g., to "skip" downwards from the time behavior depicted in dashed line to the time behavior depicted in full line. This event, possibly in combination with some amount of inaccuracy in the analog gain, may turn out to be the source of, e.g., a glitch GLTC in the output signal, which may be perceived as audible "clicks" in an audio signal. Stated otherwise, a glitch such as GLTC may occur, e.g., if the dynamic range control gain—here 1/G, an attenuation—is applied to the signal output from the analog part 104 too early, that is before the input signal having experienced a gain G has actually propagated through the DAC 100 and the analog part 104.

In one or more embodiments this kind of impairment can be dealt with (along with other possible sources of impairment) by using control bit (e.g., single bit) information, which may be obtained by monitoring an analog signal such as OS and detecting the zero-crossing time of the same signal.

Figure 4:
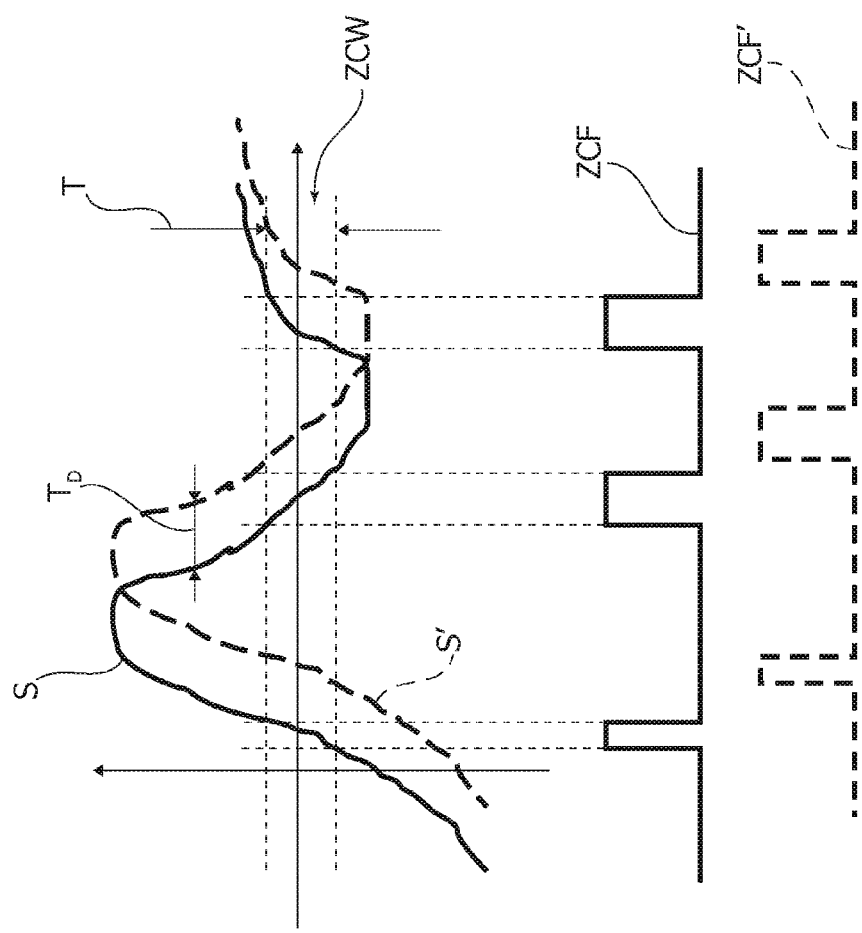
FIG. 4 is schematically representative of certain principles underlying one or more embodiments.

FIG. 4 is a schematic representation of zero crossing events which may lead a signal S (e.g., an analog audio signal) to enter/exit a certain amplitude range, e.g., a certain amplitude window ZCW, whose width is identified by a threshold value T.

For the sake of simplicity, throughout this description reference will be made to a window ZCW centered about a zero value, i.e., a symmetrical window between −T and +T. The signal S will thus be "inside" the window ZCW when having a value between −T and +T, and "outside" the window ZCW when having a value below −T or above +T.

Those of skill in the art will otherwise appreciate that, in one or more embodiments, the window ZCW may be non-symmetrical and/or centered about a non-zero value, so that the crossing events leading the signal S to enter/exit the amplitude range (e.g., the window ZCW) may not necessarily be "zero" crossing events. Consequently, throughout this exemplary description, referring to "zero" crossings will be for the sake of brevity and simplicity only, and will thus apply to detecting crossing of non-zero thresholds, with no limitation to the embodiments.

The diagram of FIG. 4 is generally exemplary of the possibility of generating (by any means known for that purpose, e.g., a threshold comparator) a "flag" signal ZCF indicating if the value of the signal from which the flag is generated S lies within a certain range (e.g., within the window ZCW or outside the window ZCW).

For instance, as exemplified in FIG. 4, the flag ZCF may be set to "1" if the signal S is within the window ZCW and set to "0" if the signal S is outside the window ZCW. A complementary choice (e.g., "0" if within the window ZCW and "1" if outside) is however possible.

The diagram of FIG. 4 is exemplary of the possible effect of a generic time delay $T_D$ causing the signal S (in full line) to "slide," e.g., rightwards and thus become a signal S' (in dashed line) which enters/exits the window ZCW at different times with respect to the signal S, as reflected by a corresponding change in the flag signal ZCF'. The diagram of FIG. 4 is thus exemplary of the possibility of detecting the time delay $T_D$ based on possible changes in the flag signal ZCF.

This concept may be applied to perform dynamic range control in a scenario as exemplified in FIG. 1 (e.g., an audio amplifier chain fed with an audio signal from a CD player), where, due, e.g., to the unknown delay $T_A$ produced by the analog part 104, the information content of the actual final analog signal OS may be different from the content conveyed by the digital version IS, e.g., by being possibly affected by events such as glitches as schematically represented in FIG. 3.

One or more embodiments may thus rely on the approach schematically represented in FIG. 4 (i.e., the "zero" crossing behavior of the actual signal deriving from D/A conversion being different from the behavior of the digital version of the audio stream) by producing a sampled version of the flag signal ZCF (used as a feedback signal, e.g., from the analog output OS) so that the related information may be processed in the digital domain.

Figure 5:
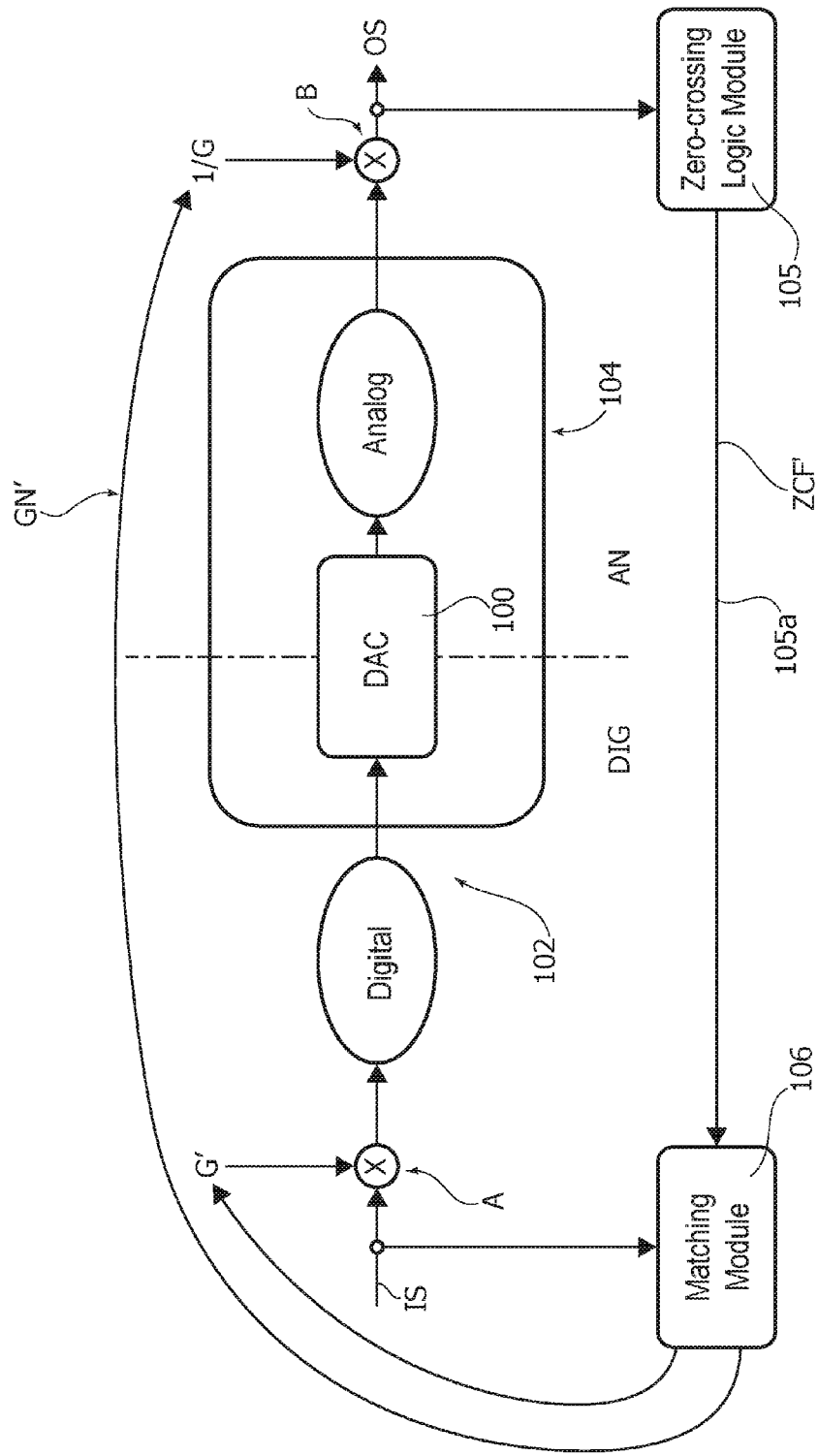
FIG. 5 is a schematic representation of one or more embodiments.

One or more embodiments may apply this approach as schematically represented in the block diagram of FIG. 5. In the block diagram of FIG. 5, parts or elements identical or similar to those already introduced previously, e.g., with reference to the block diagram of FIG. 1 are indicated with the same reference symbols. A corresponding description will not be repeated here for brevity.

In one or more embodiments, in addition to the basic elements already introduced with reference to the block diagram of FIG. 1, the block diagram of FIG. 5 may include:
- a "zero crossing" logic module 105 (e.g., a comparator), coupled, e.g., at the output of the node B in order to may produce over a line 105a zero crossing information related to the output signal OS (e.g., single bit information such as ZCF' in FIG. 4), and
- a "zero crossing" matching module 106, sensitive to the input signal IS and to the zero crossing information produced by the module 105 on the line 105b.

It will again be recalled that, throughout this exemplary description, referring to "zero crossing" is primarily for the sake of brevity and simplicity and may also cover detecting crossings of non-zero thresholds, with no limitation to the embodiments.

Similarly for the sake of simplicity, in the representation of FIG. 5, the module 105 is shown coupled "downstream" of the node B (that is after the dynamic range control gain 1/G is applied), while the module 106 is shown coupled "upstream" of the node A (that is before an input gain G' is applied). It will be appreciated that this layout is not per se mandatory insofar as, e.g., in one or more embodiments the zero crossing information related to the output signal OS may be produced by a module 105 coupled upstream of the node B.

In one or more embodiments, the matching module 106 may act on the gain notification function GN (however implemented) by creating a time-variable gain notification function GN' adapted to take into account the unknown component (see, e.g., $T_A$ in FIG. 3) of the delay of the analog part 104.

Optionally, in one or more embodiments, as further discussed in the following, the matching module 106 may also act on the gain G' applied at the node A to take into account (and compensate) other factors: e.g., in one or more embodiments, the (digital) gain G' may be varied in order to compensate a variation in the attenuation experienced by the signal in propagating through the analog part 104.

For instance, such an optional gain control (compensation) feature may not be included in one or more embodiments aiming primarily at compensating the effects of the unknown propagation delay Tan, thus leading to simple implementations (for instance, comparators with a single—e.g., positive or negative sign—threshold in the place of comparators with two thresholds (e.g., "window" comparators).

In one or more embodiments, the compensation function (s) discussed in the foregoing may take place via digital hardware and/or software, thus increasing the level of monitoring of the analog environment.

By referring to the general representation of FIG. 5, one or more embodiments may thus exploit two types of data, i.e.:
- the digital version of the signal IS before D/A conversion at 100, e.g., to generate at 106—in the digital domain—a ZCF flag (hereinafter referred to as Est. ZCF) corresponding to a predicted, estimated behavior of the output (analog) signal, and
- a sampled version of the flag signal as received from the analog environment (e.g., as received in the module 106 from the module 105), hereinafter referred to as a "hardware" ZCF, HW ZCF.

One or more embodiments may thus generate in the module 106—in the digital domain (e.g., 44.1 kHz SW)—an expected predicted behavior (that is Est. ZCF) of the (analog) signal: any differences between such predicted version Est. ZCF of the flag and the sampled version of the actual flag HW ZCF of the output signal, e.g., from the input/output of the node B, as sensed by the module 105 may thus be indicative of the total delay experienced by the signal between the node A and the node B, that is the delay Tdig of the digital part 102 plus the delay Tan of the analog part 104.

One or more embodiments may thus rely on the recognition that the effects of the D/A processing chain on the signal fed thereto (e.g., the delay Tdig+Tan, including the "unknown" delay Tan) may be predicted/estimated in the digital domain (e.g., at 106).

In one or more embodiments, the train of pulses HW ZCF corresponding to the zero-crossing events may, in case of the delayed signal (Tdig+Tan), be time-translated—that is, shifted over time—with respect to the zero crossing events evaluated as Est. ZCF in the original digital sampled domain.

One or more embodiments may thus rely on the recognition that, given the ability of evaluating that delay, the possibility exists of applying a corresponding value of delay to the gain control signal GN' sent to the analog part. Assuming a perfect tuning, namely a correct analog gain 1/G applied at the correct time, then the gain G' in the digital domain can be compensated by avoiding events such as glitches as shown in FIG. 3.

In one or more embodiments, an evaluation of the unknown delay $T_A$ (see FIG. 3) may be carried out by comparing (correlating) the, e.g., single bit flag HW ZCF from the analog subsystem with an estimated version Est. ZCF generated locally (e.g., in the digital module 106), with adequate operation being achieved when the delayed version HW ZCF is aligned with the predicted version Est. ZCF.

Those of skill in the art will otherwise appreciate that the exemplary cases presented in this detailed description may apply irrespective of whether a "1" or "0" is assigned to the ZCF flag to indicate that the corresponding signal lies within the window ZCW.

In one or more embodiments, various conditions may thus apply when comparing two ZCF flags (HW ZCF and Est. ZCF) schematically illustrated in the table below.

| HW ZCF | Digitally predicted replica (e.g., Est. ZCF) | |
|---|---|---|
| 0 | 0 | No useful meaning |
| 0 | 1 | False ZCF |
| 1 | 0 | Missed ZCF |
| 1 | 1 | Correct ZCF detection |

The No ZCF" condition, e.g., HW ZCF=0 Est. ZCF=0 (that is with both signals "off window") as well as the "False ZCF" and "Missed ZCF" conditions (that is with either signal "off window") may be hardly of interest for comparing two ZCF signals because in those cases the value of the actual output analog signal OS can be totally different from any digital estimation thereof.

In one or more embodiments, only the '1-1' condition, e.g., HW ZCF=1 Est. ZCF=1 (i.e., with both signals lying within the respective threshold window) may be taken into account in comparing the signals IS and OS, e.g., in checking performance of the chain by evaluating the matching of two ZCFs.

In one or more embodiments, comparison of two ZCF signals may be performed (only) when the two ZCF signals at issue may be regarded as produced from signals whose amplitude falls within a respective window ZCW, e.g., when the output of the analog part 104 is within a respective window ZCW (see FIG. 4) and the same may be held to apply for any homologous "estimated" signal as obtained in the module 106.

One or more embodiments may thus involve comparing (e.g., at 106 in FIG. 5) two flag signals, namely HW ZCF (obtained in the module 105 from the analog output and sent over the line 105a) and Est. ZCF (obtained from the digital input in the module 106) and producing (e.g., again in the module 106) a signal as a function of the result of the ZCF comparison which is indicative of an amount these respective flag signals HW ZCF, Est. ZCF correspond (i.e., match) with each other.

The signal in question may thus be exploited to control the time-variable delayed gain notification signal GN' in order to ensure, e.g., that any glitch GLTC as shown in FIG. 3 may be avoided, by making sure that the dynamic range control gain—here an attenuation 1/G—is applied to the signal output from the analog part 104 (only) at a time when the input signal having experienced a gain G' has effectively propagated through the DAC 100 and the analog part 104 (and, e.g., not earlier, as exemplified in FIG. 3).

In one or more embodiments, this may be a simple, cost-effective solution to implement.

Figure 6:
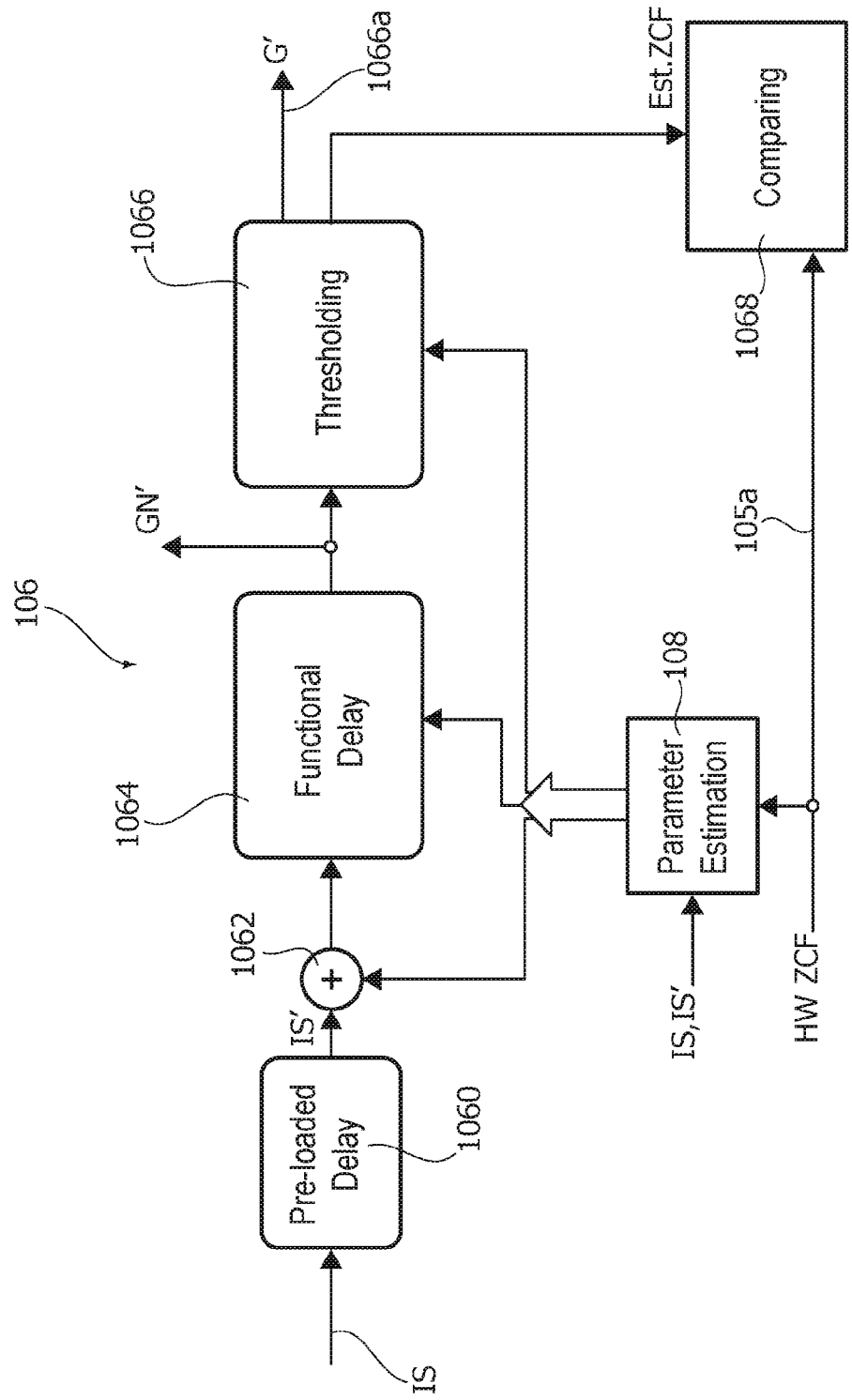
FIGS. 6 and 7 are block diagrams exemplary of various functions which may be performed in one or more embodiments.

In one or more embodiments, the module 106 may be pre-loaded (e.g., in production) with an "integer" estimated value for the delay Tdig+Tan as schematically represented in FIG. 6. For instance, the digital input signal IS may thus be subjected to plural delays, including a first "integer" (e.g., pre-loaded) delay 1060 and (possibly after a DC offset compensation at a summation node 1062) a further "fractional" delay 1064 and a thresholding (e.g., control of the gain G') operation 1066 in order to produce an estimated ZCF value Est. ZCF.

In a block 1068 an evaluation may be made of the degree of matching of the parameters estimated on the basis of the "coincidences" of the HW ZCF and Est. ZCF flags from the blocks 105 (line 105a) and 106, with, e.g., a 100% flag coincidence being pursued with the time-variable delayed gain notification signal GN' resulting from the combined delays of the blocks 1060 ("integer") and 1064 ("fractional").

In a simple embodiment, generating the time-variable delayed gain notification signal GN' may involve applying to the basic notification signal GN a time delay which is a function of the result of comparison of Est. ZCF and HW ZCF, e.g., a time delay which gradually increases until Est. ZCF and HW ZCF match (e.g., coincide).

Further details in respect of how the unknown delay Tan of the analog part 104 may be estimated may be gathered from the following description related to FIGS. 7 to 11.

Compensation of an estimated value for Tan may involve applying a digital gain notification to the analog part 104 with a flag GN' delayed of an amount equal to Tan as estimated.

Another option may involve estimating a digital gain to be applied at a point of the digital part (blocks 102), e.g., at the input of the DAC 100 and sending a flag to the analog part 104 without delay, by applying such a digital gain at a point "upstream" of the point where the gain is evaluated.

By way of a simple example, this latter option would essentially correspond to evaluating a gain at the end of a delay line and applying that delay at an intermediate point of the delay line.

One or more embodiments may thus provide a method of performing dynamic range control in a signal processing chain (such as 100, 102, 104) producing an analog output signal OS from a digital input signal IS, wherein a dynamic range control gain (e.g., 1/G) is applied (e.g., at node B) to the analog output signal OS as a function of an input gain G' applied (e.g., at node A) to the digital input signal IS, with the dynamic range control gain applied to the analog output signal OS with a delay (as expressed, e.g., by GN') with respect to the input gain applied to the digital input signal IS.

In one or more embodiments, the method may include:
generating a first flag signal HW ZCF for the analog output signal OS and a second flag signal Est. ZCF for the said digital input signal IS wherein each flag signal assumes a first level and a second level and is set to the first level when a signal from which the flag is generated has a value within a certain amplitude range (see, e.g., the window ZCW in FIG. 4),
comparing the first flag signal HW ZCF for the analog output signal OS and the second flag signal Est. ZCF for the digital input signal IS,
controlling the delay (e.g., GN') with which the dynamic range control gain is applied to the analog output signal OS as a function of the result of the comparison.

In one or more embodiments, control may take place in such a way as to cause the first flag signal HW ZCF for the analog output signal OS and the second flag signal Est. ZCF for the digital input signal IS to match (e.g., to coincide).

By way of non-limiting example, possible options for comparing HW ZCF with any ZCF flag (e.g., Est. ZCF) generated for the digital input signal may include counting the number of matches in a defined time frame, calculating the ratio of the number of matches to the total number of HW ZCF flags over a certain time frame, calculating the variance of the number of success matching over a certain time frame, or any other means of determining the extent or degree the two ZCF flags, correspond (e.g., coincide) with each other.

The signals to control the "fractional" delay 1064, as well as the windowing (thresholding) 1066 operation and the DC offset compensation at the summation node 1062 may be generated in an estimation block 108 to be described in the following.

In one or more embodiments, adequate operation of the system may occur (e.g., within a certain tolerance range) when the flag signal HW ZCF on the line 105a as obtained by the module 105 for the analog output signal OS and the estimated value Est. ZCF coincide, that is match with each other, which may correspond, e.g., to the sum of the "integer" delay 1060 and the "fractional" delay 1064 being equal to Tdig+Tan, that is the total delay applied by the signal processing chain 102 (digital), 100 (D/A converter), 104

(analog) to the input signal (IS); this in turn represents the total delay experienced by the input signal IS in traversing the signal processing chain 102 (digital), 100 (D/A converter), 104 (analog).

This by otherwise noting that while Tdig will be generally known (e.g., as a design parameter), Tan will not be known a priori and may be measured (estimated), so that Tdig+Tan may lead to a correct value for the delay applied to the time-variable delayed gain notification signal GN'.

In one or more embodiments, a system as exemplified herein may be configured for possible estimation (performed "run-time", e.g., during operation) of operating parameters which may be generated in a parameter estimation block 108. This may be arranged as exemplified in FIG. 7, e.g., in view of possible operation based on the concept outlined in FIG. 8, with the estimated parameters converging to a correct value EV.

In one or more embodiments, a count of matches of flag signals including the "hardware" flag signal (e.g., HW ZCF) representative of the analog output OS (e.g., before the dynamic range control gain 1/G is applied) with certain flag signals obtained by processing the digital input signal IS (with the gain G' again assumed to be included for simplicity) may be used in the block 108 as a metrics in such estimation process which is suitable to be performed run time, e.g., during system operation.

In one or more embodiments one or more such estimated parameters (e.g., primarily the delay, but also the gain G') as considered herein may be used to drive a control loop (see, e.g., the lines GN' and G' in FIG. 5) in order to compensate the effects of the analog part 104.

In these cases, the system will be able to self-compensate these effects so that, e.g., HW ZCF and Est. ZCF as discussed previously will mostly match.

Figure 7:
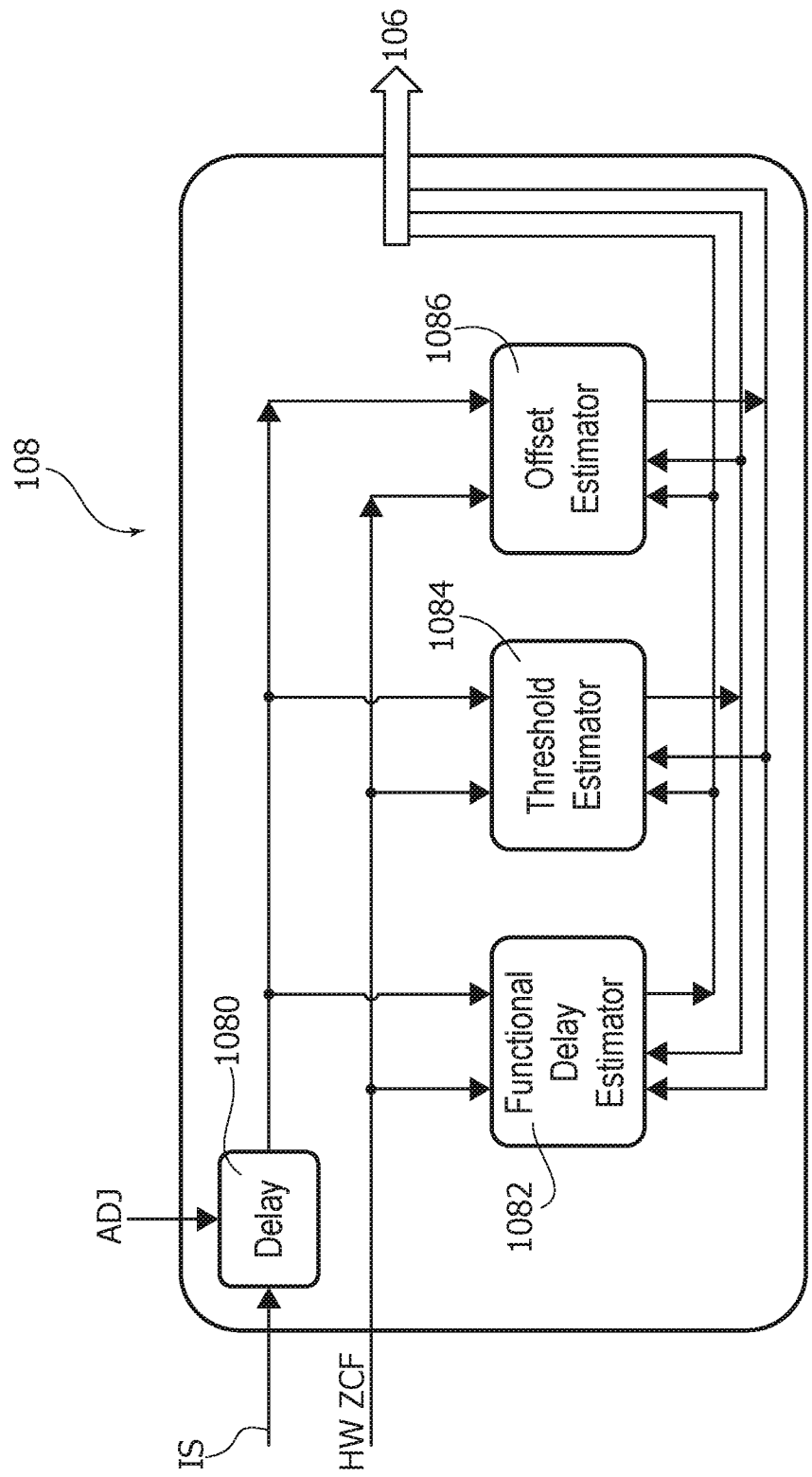

Similar comparisons between, e.g., HW ZCF and other ZCF flags obtained from the digital input signal IS may however be performed in parameter estimation/tracking as performed in the exemplary estimation layout shown in FIG. 7, where the block 108 includes, possibly in addition to an adjustable integer or bulk delay ADJ block 1080 (adapted to be used for, e.g., "trimming" the estimator):

a first estimation circuit/function 1082 for a "fractional" (e.g., fine adjustment) delay to be applied at 1064;
a second estimation circuit/function 1084 of one or more threshold(s) for windowing at 1066;
a third estimation circuit/function 1086 for a DC offset to be applied at 1062.

In one or more embodiments as exemplified herein, the bulk or integer delay to be applied at 1080 may be an initial, "rough" adjustment parameter ADJ of the system, not intended to be subsequently modified.

It will be appreciated that controlling the threshold(s) for windowing at 1066 in FIG. 6 may de facto correspond to tuning the gain G' applied at the input signal IS at the node A. For that reason an output control line 1066a for the gain G' is shown in FIG. 6.

One or more embodiments may provide for a different choice of the parameters being estimated. For instance, in one or more embodiments, not all of delay, threshold (gain G') and DC offset but only one or two of these parameters may be considered in addition to the delay. In one or more embodiments, other parameters may be added to and/or substituted for threshold/gain G' and DC offset.

The diagrams of FIGS. 8 to 12 are exemplary of one or more embodiments where the estimation parameters may be determined during operation of the system (e.g., in block 108 in FIG. 2), e.g., during a training phase and/or during regular operation, in order to automatically compensate the effects of the analog part 104 on dynamic range control, that in applying the gain 1/G at the output of the DAC chain to counter the gain G at the output of the DAC chain.

In one or more embodiments as exemplified in FIG. 7, the estimator blocks 1082, 1084 and 1086 may operate by determining an exact (target) value EV for each parameter as a stationary point for a performance function.

Figure 8:
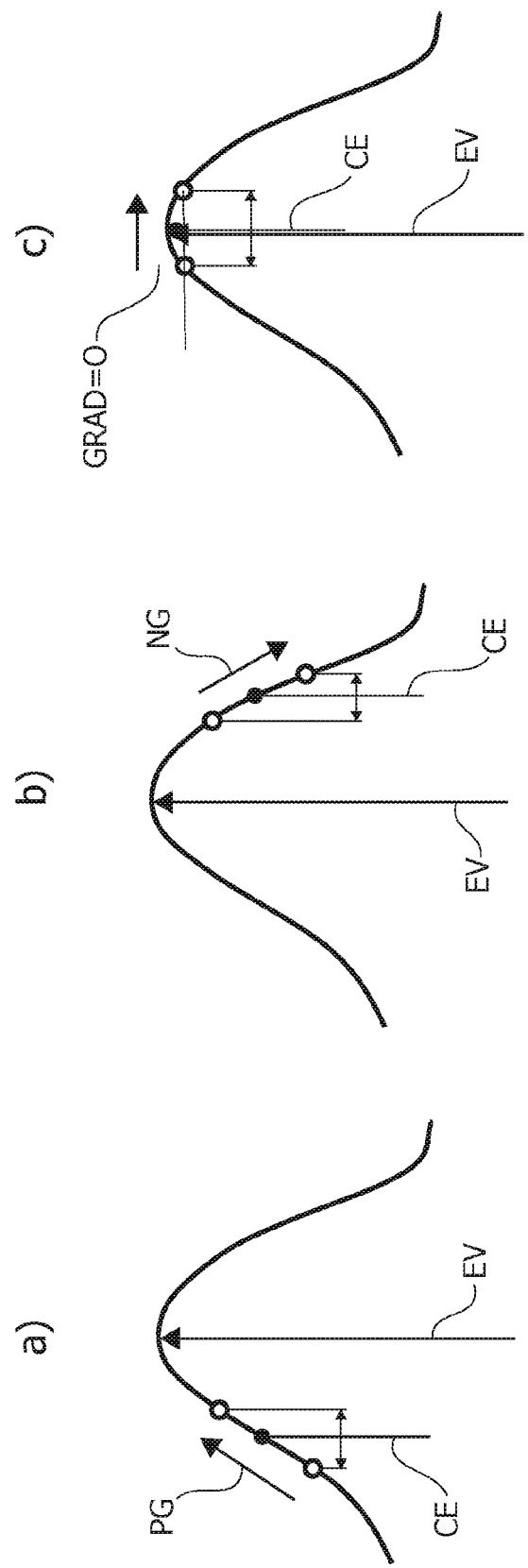
FIG. 8, including three portions designated a), b) and c), respectively, is exemplary of possible operation of embodiments.

Such an approach is schematically represented in the diagrams of FIG. 8, where:

the portion a) shows a current estimated value CE which is, e.g., lower than the exact value EV, so that a corresponding "performance function" exhibits a positive gradient PG towards a peak (e.g., optimum) value;
the portion b) shows a current estimated value CE which is, e.g., higher than the exact value EV, so that the corresponding performance function exhibits a negative gradient NG away from the peak value;
the portion c) shows a current estimated value CE which is at or in close proximity of the exact value EV, so that the corresponding performance function no longer exhibits a gradient, i.e., a zero (or almost zero) gradient GRAD=0 which indicates that the current estimated value CE has reached the exact value EV.

In one or more embodiments, specific performance functions may be defined for each parameter. For instance, a useful performance function both for fractional delay and for DC offset may be selected as the difference of successful detections (1-1: see the last line in the preceding table) of certain ZCF flags discussed in the following over a fixed time frame, e.g., based on a so-called Integrate and Dump (I&D) approach.

In one or more embodiments, a useful performance function for threshold(s)/gain G' at 1066 may be selected as the difference of "false detection" (1-0) events vs. "missed detection" (0-1) events of certain ZCF flags discussed in the following (see the second and third lines in the preceding table), again over a fixed time frame, e.g., based on an I&D approach.

In one or more embodiments, the performance function (selected, e.g., as exemplified previously) may be evaluated at two nearby points, and the estimated value of the parameter may be tuned with a control loop. In one or more embodiments such a loop may include an "integral" operator.

In one or more embodiments, the estimation process converges to the correct values for all the parameters, while an estimation of each parameter may become available to the user as a side effect.

The whole of this processing lends itself to being effected in digital form, e.g., by means of a conventional DSP, e.g., as exemplified in the following.

Figure 9:
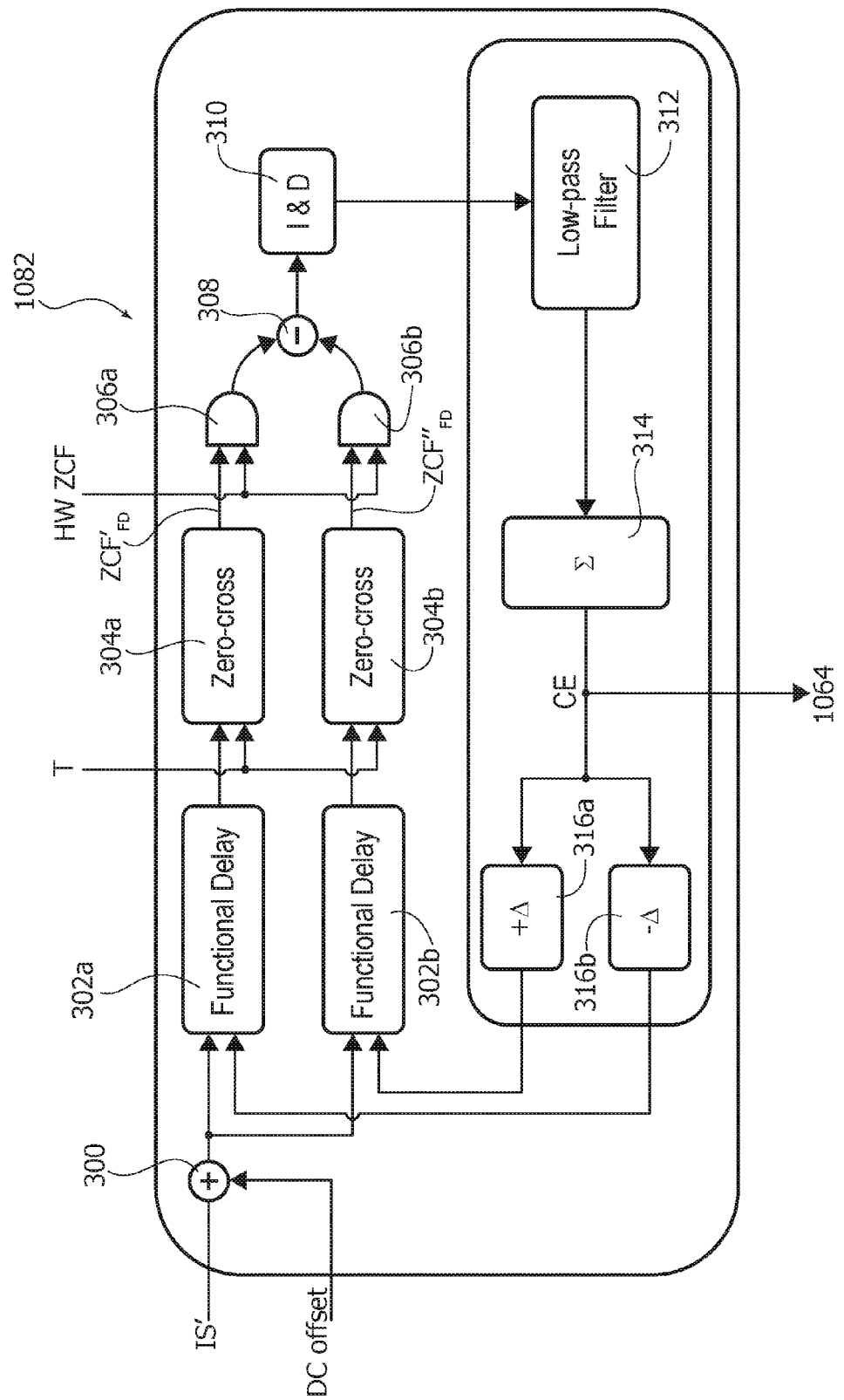
FIGS. 9 to 11 are block diagrams exemplary of various functions which may be performed in one or more embodiments.

The diagram of FIG. 9 is representative of an exemplary arrangement for a fractional delay estimator 1082 to provide an estimated fractional delay value to the delay element (filter) 1064 of FIG. 6.

In one or more embodiments, the estimated fractional delay value provided to the delay element (filter) 1064 of FIG. 6 together with the "integer" delay 1060 and the "fractional" delay 1064 may be equal to Tdig+Tan, and thus correspond to an estimate of the whole delay applied to the signal IS by the processing chain including the digital block(s) 102, the D/A converter 100 and the analog block(s) 104. The estimation thus provided may thus result in the control loop shown in FIG. 6 to converge to a situation where Est. ZCF and HW ZCF match (e.g., coincide), which corresponds to a correct control of the time variable delayed gain notification GN'.

In one or more embodiments, input to the estimator 1082 may include:
- the input data stream, after application of the integer or bulk delay at 1060, denoted IS';
- a DC offset value as estimated by the estimator 1086;
- a threshold value T as estimated by the estimator 1084,
- the "hardware" ZCF flag, HW ZCF, from the block 105.

In one or more embodiments, the data stream IS' and the DC offset value may be added in a node 300 and fed to two fractional delay blocks 302a, 302b to which the current fractional delay estimation (that is CE in the diagrams of FIG. 8) is fed with added positive and negative "deltas" $+\Delta$ and $-\Delta$, respectively. The fractional delay blocks 302a, 302b may thus apply two different values of fractional delay so that a sort of corresponding gradient may be computed: see, e.g., PG or NG in FIG. 8, parts a) and b).

The outputs from the blocks 302a, 302b are subjected to windowing in "zero cross" blocks 304a, 304b (as a function of the threshold T) and the ZCFs, e.g., $ZCF'_{FD}$ and $ZCF''_{FD}$, obtained thereby may fed to logical product (AND) blocks 306a, 306b whose other inputs are fed with the signal HW ZCF and whose outputs converge to a difference node 308 and on to an integrate-and-dump (I&D) block 310.

Such processing produces a difference of successful detections (essentially like 1-1 events in the previous table) over a fixed time frame, which may be used as a performance function as discussed previously.

Possible low pass filtering at 312 derives from the result of I & D processing at 310 a fractional delay estimation error, for use by an integrator block 314. The output from the integrator 314 becoming constant—see, e.g., GRAD=0 in FIG. 8, part c)—will correspond to a correct estimated value EV for the fractional delay, e.g., for feeding to the fractional delay filter 1064 of FIG. 6 (and possibly to other processing blocks as otherwise detailed).

The output from the block 314 is also fed to two delta generation blocks 316a, 316b for feeding to the fractional delay blocks 302a, 302b as discussed previously.

Figure 10:
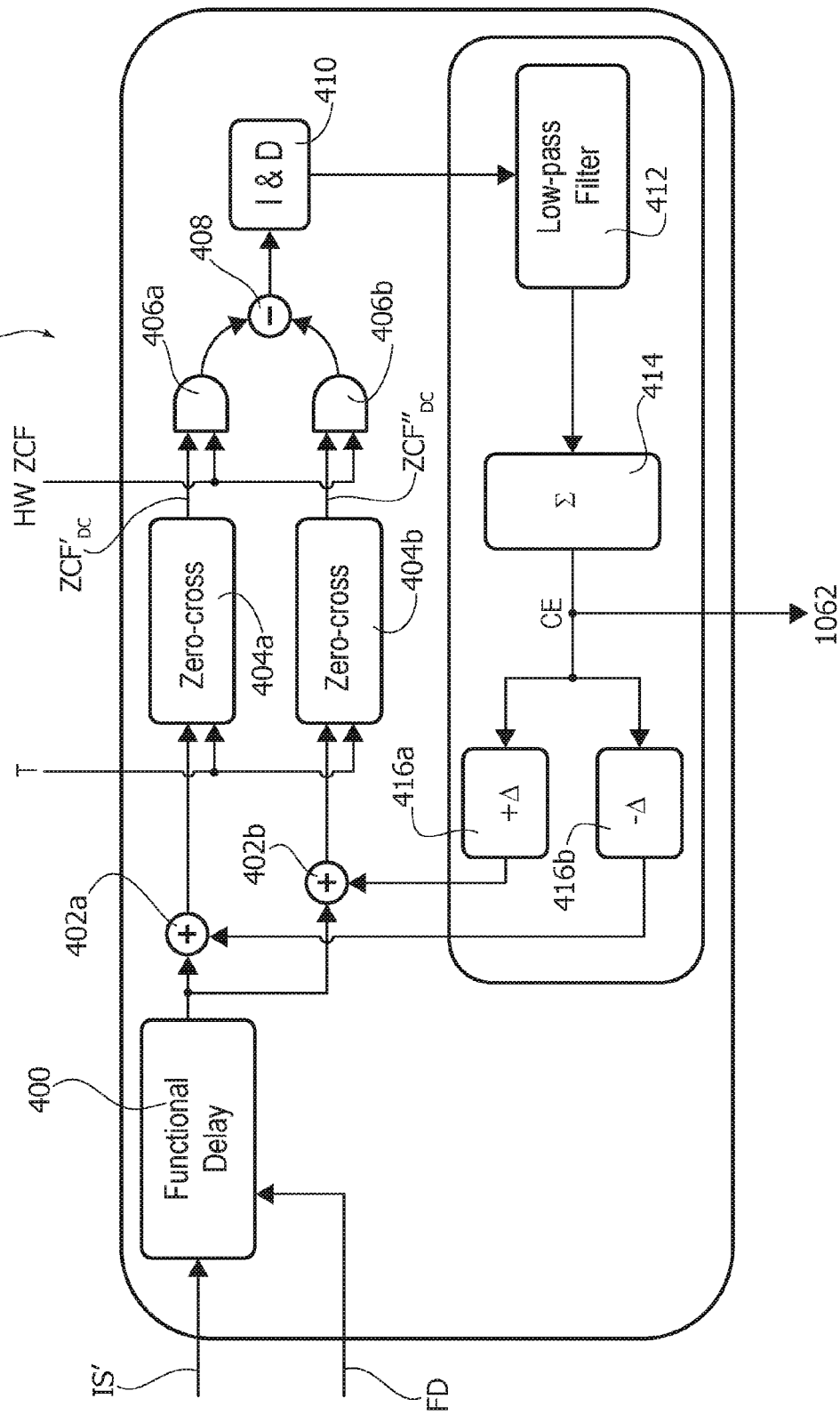

The diagram of FIG. 10 is representative of an exemplary arrangement for a DC offset estimator 1086 to provide an estimated DC offset value to the summation node 1062 of FIG. 6.

In one or more embodiments, input to the estimator 1086 may include:
- the input data stream, again after application of the integer or bulk delay at 1060, denoted IS';
- a fractional delay value as estimated by the estimator 1082 discussed previously;
- a threshold value T as estimated by the estimator 1084,
- the "hardware" ZCF flag, HW ZCF, from the block 105.

In one or more embodiments, the data stream IS' and the fractional delay value may be combined in a fractional delay block 400 wherein the latest (i.e., most recent) estimate available for the fractional delay is applied to the data stream IS' to be fed to two summation nodes 402a, 402b to which the current DC offset estimation (that is CE in the diagrams of FIG. 8) is fed with added negative and positive "deltas" $-\Delta$ and $+\Delta$, respectively, so that, again a sort of corresponding gradient may be computed: see again, e.g., PG or NG in FIG. 8, parts a) and b).

The outputs from the nodes 402a, 402b are subjected to windowing in "zero cross" blocks 404a, 404b (as a function of the threshold T) and the ZCFs obtained thereby, e.g., $ZCF'_{DC}$ and $ZCF''_{DC}$, are fed to logical product (AND) blocks 406a, 406b whose other inputs are fed with the signal HW ZCF and whose outputs converge to a difference node 408 and on to an integrate-and-dump (I&D) block 410.

Such processing produces the difference of successful detections (again essentially like 1-1 events in the previous table) over a fixed time frame which may be used as a performance function as discussed previously.

Possible low pass filtering at 412 derives from the result of I & D processing at 410 a DC offset estimation error, for use in an integrator block 414.

As is the case of the integrator block 314 discussed previously, the output from the integrator 414 becoming constant—see again, e.g., GRAD=0 in FIG. 8, part c)—will correspond to a correct estimated value EV for the DC offset for feeding, e.g., to the DC offset summation node 1062 of FIG. 6 (and possibly to other processing blocks as otherwise detailed).

The output from the block 414 is also fed to two delta generation blocks 416a, 416b for feeding to the summation nodes 402a, 402b as discussed previously.

Figure 11:
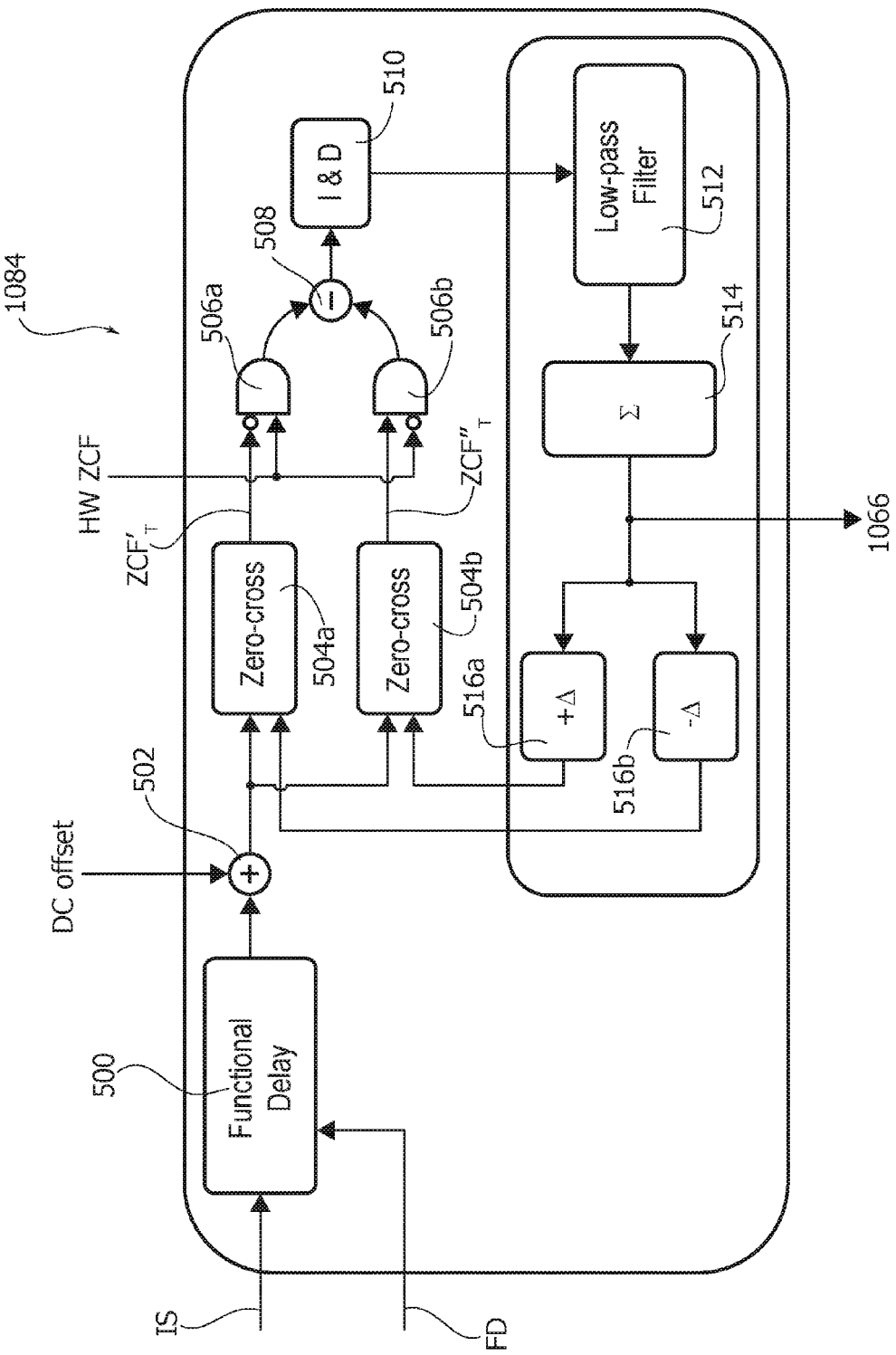

Finally, the diagram of FIG. 11 is representative of an exemplary arrangement for a threshold estimator 1084 to provide at least one estimated threshold value to the windowing logic 1066 of FIG. 6.

While plural thresholds may be estimated, e.g., in the case of a non-symmetric window ZCW, a single threshold value T (e.g., for producing a symmetrical $-T$, $+T$ window) is considered here for the sake of simplicity. Also, as indicated in the foregoing, in one or more embodiments aiming primarily at compensating the effects of the unknown propagation delay Tan (e.g., without providing for adaptively setting the gain value G') comparators with a single—e.g., positive or negative sign—threshold may be used in the place of comparators with plural thresholds.

In one or more embodiments, input to the estimator 1084 may include:
- the input data stream IS;
- a fractional delay value as estimated by the estimator 1082 discussed previously;
- a DC offset value as estimated by the estimator 1086,
- the "hardware" ZCF flag, HW ZCF, from the block 105.

In one or more embodiments, the data stream IS and the fractional delay value may be combined in a fractional delay block 500 wherein (as is the case for the fractional delay block 400 discussed previously) the latest (i.e., most recent) estimate available for the fractional delay is applied to the data stream IS to be fed to a summation node 502 to which the current DC offset estimation (that is CE in the diagrams of FIG. 8) is fed.

The output from the node 502 are subjected to windowing in "zero cross" blocks 504a, 504b as a function of the current estimation threshold T with added positive and negative "deltas" $+\Delta$ and $-\Delta$, respectively so that, once more, a sort of corresponding gradient may be computed: see once more, e.g., PG or NG in FIG. 8, parts a) and b).

The ZCFs obtained thereby, e.g., $ZCF'_T$ and $ZCF''_T$, are fed, after logical inversion (that is in negated form) to logical product (AND) blocks 506a, 506b whose other inputs are fed with the signal HW ZCF and whose outputs converge to a difference node 508 and on to an integrate-and-dump (I&D) block 510.

Such processing produce the difference of "false detections" (essentially like 0-1 events in the previous table) vs. "missed detections" (essentially like 1-0 events in the previous table) over a fixed time frame which may be used as a performance function as discussed previously.

Figure 12:
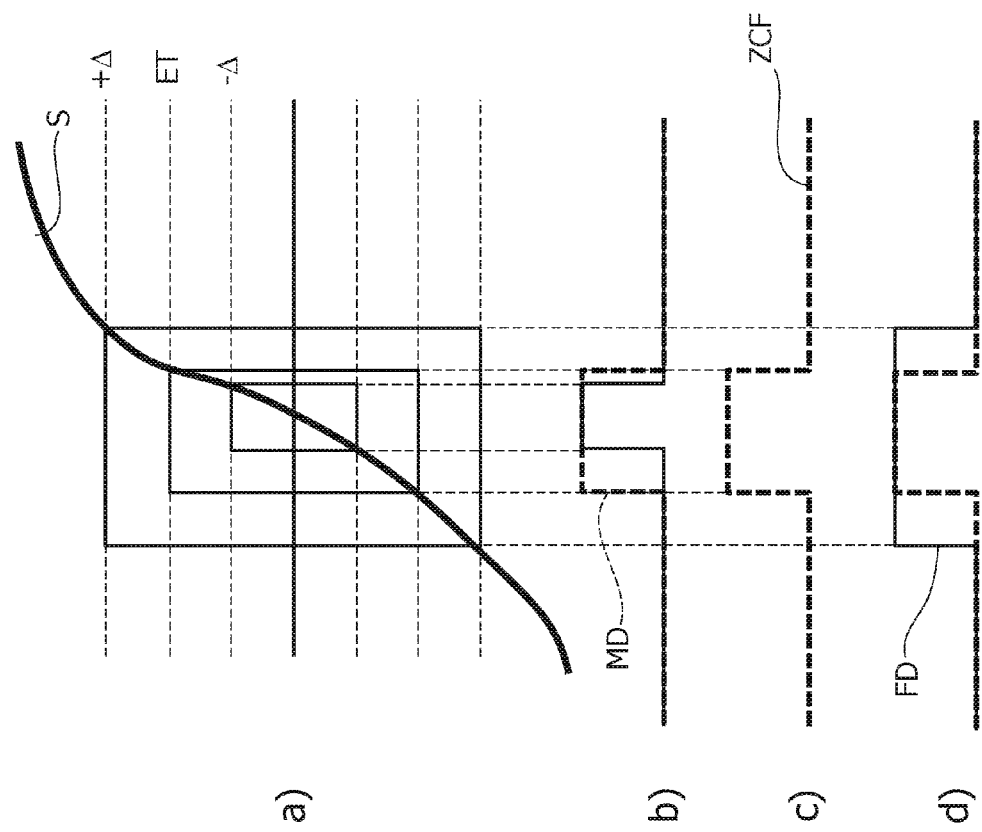
FIG. 12 is a signal diagram exemplary of possible operation of embodiments.

This approach is further exemplified in FIG. 12. There an "exact" threshold ET is shown in the upper diagram of portion a), while a corresponding ZCF for a signal S is shown in full line in portion c).

The effect of an increase (+Δ) and a decrease (−Δ) in the threshold (again a symmetrical threshold centered about zero is assumed for the sake of simplicity) in terms of missed detections MD and false detections FD is exemplified in portions b) and d) of the diagram.

Possible low pass filtering at 512 derives from the result of I & D processing at 510 a threshold estimation error, for use in an integrator block 514.

As is the case of the integrator blocks 314 and 414 discussed previously, the output from the integrator 514 becoming constant—see once more, e.g., GRAD=0 in FIG. 10, part c)—will correspond to a correct estimated value EV for feeding, e.g., to the windowing logic 1066 of FIG. 8 (and possibly to other processing blocks as otherwise detailed).

The output from the block 514 is also fed to two delta generation blocks 516a, 516b for feeding to the "zero cross" blocks 504a, 504b as discussed previously.

In addition to facilitating effective dynamic range control, in one or more embodiments, continuous tracking of one or more operating parameters may permit prompt detection of any parameter falling out of a predefined acceptable range (e.g., DC offset) so that, e.g., a corresponding alert flag may be emitted to indicate performance degradation.

One or more embodiments may thus be based on the recognition that:
one or more ZCF flags (such as Est. ZCF; $ZCF'_{FD}$ and $ZCF''_{FD}$; $ZCF'_{DC}$ and $ZCF''_{DC}$; $ZCF'_T$ and $ZCF''_T$) may be generated for the digital input signal by being estimated in digital form—e.g., by applying to the digital input signal IS, e.g., a time delay (bulk or fractional), a DC offset and a windowing based on a given threshold—without D/A conversion of the digital input signal IS;
albeit generated in an analog context, the HW ZCF derived from the output of the D/A processing chain is intrinsically a binary signal (either "1" or "0"); once sampled, e.g., at the same sampling frequency the digital input signal, the HW ZCF is a digital signal which lends itself easily to be compared with any of the ZCF flags (e.g., Est. ZCF; $ZCF'_{FD}$ and $ZCF''_{FD}$; $ZCF'_{DC}$ and $ZCF''_{DC}$; $ZCF'_T$ and $ZCF''_T$) generated for the digital input signal.

In one or more embodiments, the loop devoted to dynamic range control may be supplemented with ancillary control loops, such as, e.g., an integrator whose input may be, for instance, a parameter such as the estimated DC offset from the DC offset estimator 1086 of FIG. 10 and whose output is a value to be subtracted from/added to the input data stream (e.g., the digital input signal IS). Convergence of such a control loop will result in a DC offset measured to be practically zero and the integrator output the DC value to be compensated.

One or more embodiments may implement such a control function in real time, while the system (e.g., an audio chain) processes the real (e.g., audio) signal and the integrator tracks, e.g., the DC offset variations.

In one or more embodiments, various analog components may thus be dispensed with, with advantages in terms of cost and in space, by moving towards a fully digital approach, where SW implementation is possible, while permitting real time measurement of relevant parameters.

One or more embodiments may thus permit to operate a dynamic range control chain which produces an analog output signal OS from a digital input signal IS.

In one or more embodiments at least one first flag signal (e.g., HW ZCF) is generated for the analog output signal OS and one or more second flag signals (e.g., Est. ZCF; $ZCF'_{FD}$, $ZCF''_{FD}$; $ZCF'_{DC}$, $ZCF''_{DC}$; $ZCF'_T$, $ZCF''_T$) are generated for the digital input signal IS.

In one or more embodiments, each of these flag signals may assume a first level and a second level (e.g., "1" and "0") and be set to the first level (e.g., "1") when a signal from which the flag is generated has a value within a certain amplitude range (e.g., a certain amplitude window).

For instance, in case a single output signal OS is present, the flag HW ZCW may be "1" if the output signal OS lies within its thresholding window and "0" otherwise.

Certain embodiments may to scenarios where plural analog output signal components may be present (e.g., a stereo or multi-channel audio system).

In that case, these plural analog signals may generate, due to thresholding, respective "on/off" signals which may produce (e.g., as a result of "OR" processing) a flag HW ZCW for the output signal OS which may be "1" if any the analog output signal components subject to thresholding lies within its thresholding window.

Consequently, one or more embodiments may provide for generating "at least one first flag signal" HW ZCF for the analog output signal OS.

The same applies to any of the "second" flag signals such as Est. ZCF; $ZCF'_{FD}$, $ZCF''_{FD}$; $ZCF'_{DC}$, $ZCF''_{DC}$; $ZCF'_T$, $ZCF''_T$, with:
Est. ZCF generated from the signal output of the fractional delay filter 1064 via thresholding at 1066 in FIG. 6;
$ZCF'_{FD}$, $ZCF''_{FD}$ generated from the output signals of the fractional delay blocks 302a, 302b via thresholding at 304a, 304b in FIG. 9;
$ZCF'_{DC}$, $ZCF''_{DC}$ generated from the output signals of the summation nodes 402a, 402b via thresholding at 404a, 404b in FIG. 10;
$ZCF'_T$, $ZCF''_T$ generated from the output signal of the summation node 502 via thresholding at 504a, 504b in FIG. 11.

One or more embodiments as exemplifies herein, the first flag signal HW ZCF and one or more of the second flag signals Est. ZCF; $ZCF'_{FD}$, $ZCF''_{FD}$; $ZCF'_{DC}$, $ZCF''_{DC}$; $ZCF'_T$, $ZCF''_T$ may be exploited in various ways in operating a digital-to-analog signal processing chain as exemplified herein. To that effect, in one or more embodiments, a first flag signal HW ZCF for the analog output signal OS may be sampled at the same sampling frequency of the digital input signal IS.

For instance, in one or more embodiments, the first flag signal HW ZCF obtained from the analog output OS and the second flag signal Est. ZCF obtained from the digital input signal IS may be compared to calculate an amount the first flag signal HW ZCF and the second flag signal Est. ZCF match with each other.

In one or more embodiments, the said amount may be selected out of:
the count of matches of the first flag signal HW ZCF and the second flag signal Est. ZCF over a certain time frame,
the ratio of the number of matches of the first flag signal HW ZCF and the second flag signal Est. ZCF to the total number of either type (HW ZCF resp. Est. ZCF) of flag signals over a certain time frame, the variance of the number of matches of the first flag signal HW ZCF and the second flag signal Est. ZCF over a certain time frame.

In one or more embodiments, a first flag signal HW ZCF obtained from the analog output OS and the various second flag signals ZCF; ZCF'$_{FD}$, ZCF"$_{FD}$; ZCF'$_{DC}$, ZCF"$_{DC}$; ZCF'$_T$, ZCF" obtained in various ways from the digital input signal IS as exemplified in connection with FIGS. 8 to 12 may be processed to calculate (e.g., in blocks 1082, 1084, 1086 in FIG. 9) an estimate of the delay Tdig+Tan, and, optionally, other operating parameters of the dynamic range control chain. As exemplified in connection with FIG. 8, the estimate of delay (and possibly other operating parameters) may be calculated as a target value EV which optimizes a respective performance function, preferably by minimizing the gradient thereof (see, e.g., GRAD=0 in FIG. 8).

In one or more embodiments, in the case of delay (and also, e.g., of DC offset) the performance function may be selected as the difference (e.g., computed at nodes 308, 408 in FIGS. 9 and 10) of successful detections (1-1 in the previous table) of the first flag signal HW ZCF the second flag signal (see, e.g., ZCF'$_{FD}$, ZCF"$_{FD}$ for the fractional delay in FIG. 9 or ZCF'$_{DC}$, ZCF"$_{DC}$ for the DC offset in FIG. 10) over a time frame, as determined, e.g., by the Integrate & Dump blocks 310, 410.

In one or more embodiments, if the estimated operating parameter includes a windowing threshold T, the performance function may be selected as the difference (e.g., computed at node 508 in FIG. 11) of false detection events and missed detection events (see, e.g., FD and MD in FIG. 12) of the first flag signal HW ZCF and the second flag signal ZCF'$_T$, ZCF"$_T$ over a time frame, as determined, e.g., by the Integrate & Dump block 510 in FIG. 11.

In one or more embodiments, a performance check signal such as an alert flag may be issued if the estimated value of at least one operating parameter such as, e.g., FD, DC offset or T lies outside a certain range acceptable for operation.

In one or more embodiments, generating the one or more second flag signals for the digital input signal IS may include applying to the digital input signal IS one or more of:
- a delay, as is the case of the delays 1060 and 1064 applied to IS to generate Est. ZCF in FIG. 6, or the delays ADJ, 302a, 302b; ADJ, 400; 500 of FIGS. 7 to 11,
- a DC offset, as is the case of the DC offset 1062 applied to IS to generate Est. ZCF in FIG. 8, or the DC offsets 300, 302b; 402a, 402b; 502 of FIGS. 7 to 11;
- windowing as a function of one or more thresholds, as is the case of the windowing 1066 applied to IS to generate Est. ZCF in FIG. 7, or the windowing blocks 304a, 304b; 404a, 404b; 504a, 504b of FIGS. 7 to 11.

Without prejudice to the underlying principles, the details and embodiments may vary, even significantly, with respect to what has been described by way of example only without departing from the extent of protection.

The extent of protection is defined by the annexed claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of performing dynamic range control in a signal processing chain, the method comprising:
   producing an analog output signal from a digital input signal;
   applying to said analog output signal a dynamic range control gain as a function of an input gain applied to said digital input signal, said dynamic range control gain being applied to said analog output signal with a delay with respect to said input gain applied to said digital input signal;
   generating at least one first flag signal for said analog output signal and at least one second flag signal for said digital input signal, wherein each said flag signal assumes a first level and a second level and is set to said first level when a signal from which the flag is generated has a value within a certain amplitude range;
   comparing said at least one first flag signal for said analog output signal and said at least one second flag signal for said digital input signal; and
   controlling said delay with which the dynamic range control gain is applied to the analog output signal as a function of the result of said comparing.

2. The method of claim 1, wherein controlling said delay with which the dynamic range control gain is applied to the analog output signal comprises causing said at least one first flag signal for said analog output signal and said at least one second flag signal for said digital input signal to match.

3. The method of claim 2 further comprising sampling said at least one first flag signal for said analog output signal at the same sampling frequency of said digital input signal.

4. The method of claim 3, wherein comparing said at least one first flag signal for said analog output signal and said at least one said second flag signal for said digital input signal includes calculating one of:
   the count of matches of said at least one first flag signal and said at least one second flag signal over a certain time frame;
   the ratio of the number of matches of said at least one first flag signal and said at least one second flag signal to the total number of either type of said flag signals over a certain time frame; and
   the variance of the number of matches of said at least one first flag signal and said at least one second flag signal over a certain time frame.

5. The method of claim 1 further comprising calculating as a function of said at least one first flag signal and said at least one second flag signal, an estimate of at least one operating parameter of said signal processing chain selected out of:
   a delay applied by said signal processing chain to said input signal,
   an input gain applied to said digital input signal,
   a DC offset applied by said signal processing chain to said input signal.

6. The method of claim 5, wherein calculating said estimate of at least one operating parameter of said signal processing chain comprises calculating a target value which optimizes a respective performance function, preferably by minimizing the gradient thereof.

7. The method of claim 6, including:
wherein said at least one estimated operating parameter includes one or both of said delay and said DC offset applied by said signal processing chain to said input signal, selecting said performance function as the difference of successful detections of said at least one first flag signal and said at least one second flag signal over a time frame; and
wherein said at least one estimated operating parameter includes an input gain applied to said digital input signal, selecting said performance function as the difference of false detection events and missed detection events of said at least one first flag signal and said at least one second flag signal over a time frame.

8. The method of claim 1, wherein generating said at least one second flag signal for said digital input signal includes applying to said digital input signal at least one of:
a delay;
a DC offset; and
thresholding.

9. A device for dynamic range control, comprising:
a dynamic range control circuit configured to control a signal processing chain that produces an analog output signal from a digital input signal, the dynamic range control circuit configured to apply to said analog output signal a dynamic range control gain as a function of an input gain applied to said digital input signal, said dynamic range control gain being applied to said analog output signal with a delay with respect to said input gain applied to said digital input signal, wherein the dynamic range control circuit includes:
flag generating circuits for generating at least one first flag signal for said analog output signal and at least one second flag signal for said digital input signal wherein each said flag signal assumes a first level and a second level and is set to said first level when a signal from which the flag is generated has a value within a certain amplitude range;
a comparison circuit for comparing said at least one first flag signal for said analog output signal and said at least one said second flag signal for said digital input signal; and
wherein the dynamic range control circuit controls said delay with which the dynamic range control gain is applied to the analog output signal as a function of the result of said comparing in said comparison circuit.

10. The device for dynamic range control of claim 9, wherein the dynamic range control circuit comprises software code portions that are loadable in a memory of at least one digital processor device.

11. The device for dynamic range control of claim 9, wherein the flag generating circuits comprise comparators configured to generate the at least one first and second flags.

12. The device for dynamic range control of claim 9, wherein the dynamic range control circuit is further configured to apply to the digital input signal at least one of a delay, a DC offset and a thresholding to control the flag generating circuits in generating the at least one second flag signal.

13. The device for dynamic range control of claim 9, wherein the dynamic range control circuit controls the delay with which the dynamic range control gain is applied to the analog output signal as a function of the at least one first flag signal for the analog output signal and the at least one second flag signal for the digital input signal being equal.

14. The device for dynamic range control of claim 9, wherein the comparison circuit is further configured to:
determine a count of matches of the at least one first flag signal and the at least one second flag signal over a certain time frame;
determine a ratio of the number of matches of the at least one first flag signal and the at least one second flag signal to the total number of either type of the flag signals over a certain time frame; and
determine a variance of the number of matches of the at least one first flag signal and the at least one second flag signal over a certain time frame.

15. The device for dynamic range control of claim 9, wherein the dynamic range control circuit is further configured to generate an estimate of at least one operating parameter of the signal processing chain, the estimate of the at least one operating parameter including one of a delay introduced by the signal processing chain to the input signal, an input gain applied by the signal processing chain to the digital input signal, and an offset applied by the signal processing chain to the input signal.

16. The device for dynamic range control of claim 15, wherein the dynamic range control circuit is further configured to generate the estimate of the at least one operating parameter based upon a target value of each at least one operation that optimizes a respective performance function of the at least one operating parameter.

17. An apparatus, including:
a signal processing chain, configured to generate an analog output signal from a digital input signal; and
a dynamic range control device coupled to the signal processing chain, the dynamic range control device configured to apply to the analog output signal a dynamic range control gain as a function of an input gain applied to the digital input signal, the dynamic range control gain being applied to the analog output signal with a delay with respect to the input gain applied to the digital input signal, the dynamic range control circuit further configured to generate a first flag signal for the analog output signal and a second flag signal for the digital input signal, the first flag signal having a first level responsive to the analog output signal having an amplitude within an amplitude window and a second level otherwise, and the second flag signal having a first level responsive to the digital input signal having an amplitude within an amplitude window and a second level otherwise, the dynamic range control circuit configured to control the delay with which the dynamic range control gain is applied to the analog output signal based upon the first and second flag signals.

18. The apparatus of claim 17, wherein the signal processing chain comprises an audio signal processing chain.

19. The apparatus of claim 18, wherein the dynamic range control device comprises one of hardware circuitry, hardware circuitry and software code executing on at least one processor, and software code executing on at least one processor.

20. The apparatus of claim 19, wherein each at least one processor includes at least one digital signal processor (DSP).

* * * * *